United States Patent
Shimizu

(10) Patent No.: US 10,187,062 B1
(45) Date of Patent: Jan. 22, 2019

(54) SEMICONDUCTOR MEMORY DEVICE, METHOD, AND PROGRAM

(71) Applicant: TOSHIBA MEMORY CORPORATION, Tokyo (JP)

(72) Inventor: Naoki Shimizu, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/905,264

(22) Filed: Feb. 26, 2018

(30) Foreign Application Priority Data

Sep. 4, 2017 (JP) .................. 2017-169633

(51) Int. Cl.
*H03K 17/16* (2006.01)
*H03K 19/003* (2006.01)
*H03K 19/0175* (2006.01)
*G11C 29/50* (2006.01)

(52) U.S. Cl.
CPC ... *H03K 19/0175* (2013.01); *G11C 29/50008* (2013.01)

(58) Field of Classification Search
None
See application file for complete search history.

(56) References Cited

U.S. PATENT DOCUMENTS

| 8,429,313 B2 * | 4/2013 | Smith | G11C 16/10 710/17 |
| 2013/0003474 A1 * | 1/2013 | Abdulla | G11C 7/1051 365/191 |

FOREIGN PATENT DOCUMENTS

JP 2013172395 A 9/2013

* cited by examiner

*Primary Examiner* — Anh Tran
(74) *Attorney, Agent, or Firm* — Patterson & Sheridan, LLP

(57) ABSTRACT

According to one embodiment, a semiconductor memory device that is not equipped with an operating state notification terminal for providing notification of the operating state of the memory device includes a data bus comprising a plurality of signal lines and a controller configured to adjust an impedance of a signal line when the memory device is in a busy state and cannot receive signals transmitted thereto so as to provide notification of the operating state of the memory device during ZQ calibration.

20 Claims, 9 Drawing Sheets

SEMICONDUCTOR MEMORY DEVICE, METHOD, AND PROGRAM

CROSS-REFERENCE TO RELATED APPLICATION

This application is based upon and claims the benefit of priority from Japanese Patent Application No. 2017-169633, filed Sep. 4, 2017, the entire contents of which are incorporated herein by reference.

FIELD

Embodiments described herein relate generally to a semiconductor memory device, a method, and a program.

BACKGROUND

In the related art, in a semiconductor memory device such as a DDR3 SDRAM, a zero quotient (ZQ) calibration is performed to correct an output resistance (Ron) and dynamic on-die termination (ODT) and secure signal quality.

The ZQ calibration includes a ZQ calibration long (ZQCL) process having a long processing time that is generally performed at initialization and a ZQ calibration short (ZQCS) process having a short processing time which is periodically performed after initialization.

In both of the ZQ calibration long (ZQCL) and the ZQ calibration short (ZQCS) processes, it is not possible to receive all of the commands during the ZQ calibration period, and it is required to connect all of devices to a data bus (DQ) in a high-impedance state.

Accordingly, in a semiconductor memory device not structurally provided with a state notification terminal (also known as a ready/busy terminal) for providing the internal state (ready/busy) of the semiconductor memory device by a relationship of the number of terminals, then during ZQ calibration, even if the semiconductor memory device is in a ready state, the ready state cannot be recognized and the memory device cannot be utilized.

DETAILED DESCRIPTION

Embodiments provide a semiconductor memory device, a method, and a program capable of indicating the operating state of a semiconductor memory device during the ZQ calibration period, even if that device has not been provided with an operating state notification terminal.

In general, according to an embodiment, a semiconductor memory device that is not equipped with an operating state notification terminal for providing notification of the operating state of the memory device includes a data bus comprising a plurality of signal lines and a controller configured to adjust the impedance of a signal line when the memory device is in a busy state and cannot receive signals transmitted thereto during a ZQ calibration so as to provide notification of the operating state of the memory device during ZQ calibration of the memory device.

Hereinafter, example embodiments will be described in detail with reference to drawings.

Figure 1:
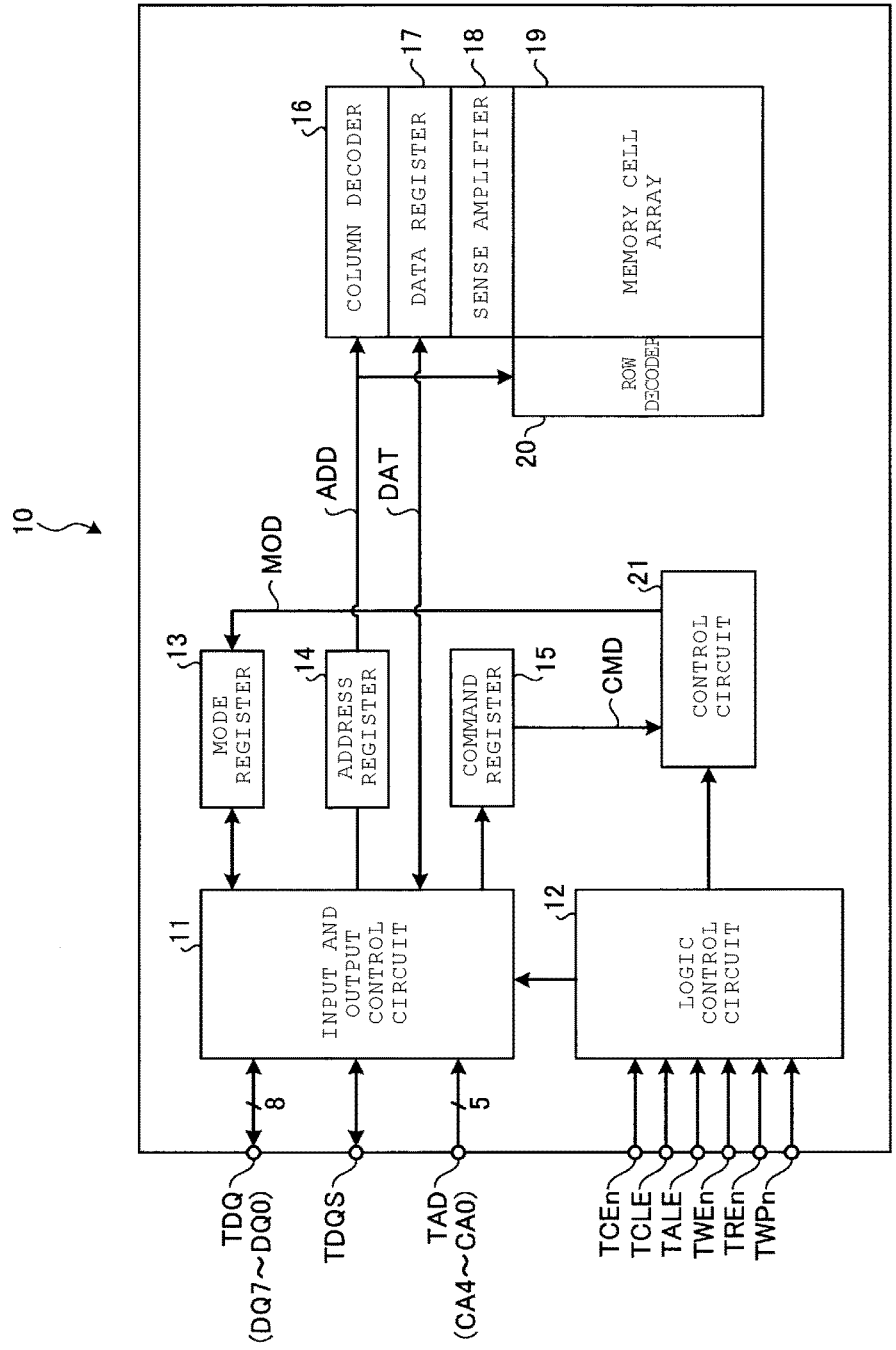
FIG. 1 is a schematic configuration block diagram of a memory chip as a semiconductor memory device of embodiments.

FIG. 1 is a schematic configuration block diagram of a memory chip.

Generally, a memory chip 10 includes an input and output control circuit 11, a logic control circuit 12, a mode register 13, an address register 14, a command register 15, a column decoder 16, a data register 17, a sense amplifier 18, a memory cell array 19, a row decoder 20, and a control circuit 21.

As an example, the input and output control circuit 11 includes eight data lines DQ7 to DQ0 corresponding to 8 bits, through which various commands, addresses, data items, or the like are input, a data bus to which data or the like read from the memory cell array is output is connected to a data bus terminal TDQ and a data strobe terminal TDQS to be connected, and the input and output of the data is controlled via the data bus terminal TDQ based on timing data or the like input from the data strobe terminal TDQS.

In addition, as an example, the input and output control circuit 11 includes five address lines corresponding to 5 bits (in FIG. 1, address lines CA4 to CA0 are denoted as address lines corresponding to a column address transmission timing related to the following description) and controls the input of addresses and commands via an address bus terminal TAD connected to an address bus to which various commands are input by utilizing the column address transmission timing.

The logic control circuit 12 analyzes the state of each terminal as described later herein and performs control according to the analysis result.

The logic control circuit 12 includes a chip enable terminal TCEn ("L" active) to which a chip enable signal CEn indicating that the memory chip 10 is selected as an operation target can be input, a command latch enable terminal TCLE to which a command latch signal CLE ("H" active) indicating whether to accept the command (command latch) via the data bus terminal TDQ can be input, and an address latch enable terminal TALE to which an address latch signal ALE ("H" active) indicating whether to accept an address (address latch) through the data bus terminal DQ can be input.

In addition, the logic control circuit 12 includes a write enable terminal TWEn to which a write enable signal WEn ("L" active) indicating whether to write data to the memory cell array 19 is input, a read enable terminal TREn to which a read enable signal REn ("L" active) indicating whether to read data from the memory cell array 19 is input, and a write protect terminal TWPn to which a write protect signal WPn ("L" active) for prohibiting writing to the memory cell array 19 is input.

The mode register 13 stores mode data MOD for controlling an operation mode as received from the input and output control circuit 11 or the control circuit 21.

The address register 14 stores address data ADD acquired by the input and output control circuit 11 via a data bus terminal DQ.

The command register 15 stores command data CMD acquired by the input and output control circuit 11 via the data bus terminal DQ.

The column decoder 16 decodes column address data included in the address data ADD and generates a signal for selecting a bit line of the memory cell array 19.

The data register 17 temporarily stores data DAT to be written in the memory cell array 19 or data DAT read from the memory cell array 19.

The sense amplifier 18 amplifies a signal read from the memory cell array 19 so as to be readable as the data DAT.

The memory cell array 19 includes a plurality of bit lines, a plurality of word lines, and a plurality of memory cells arranged two-dimensionally or three-dimensionally, and stores the data DAT.

The row decoder 20 decodes the row address data included in the address data ADD and generates a signal for selecting the word line of the memory cell array 19.

The control circuit 21 writes the mode data MOD in the mode register 13 and controls the entire memory chip 10 based on the analysis result of the logic control circuit 12 and command data MCD stored in the command register 15.

Next, an operation of the memory chip 10 will be described in detail.

1. First Embodiment

Figure 2:
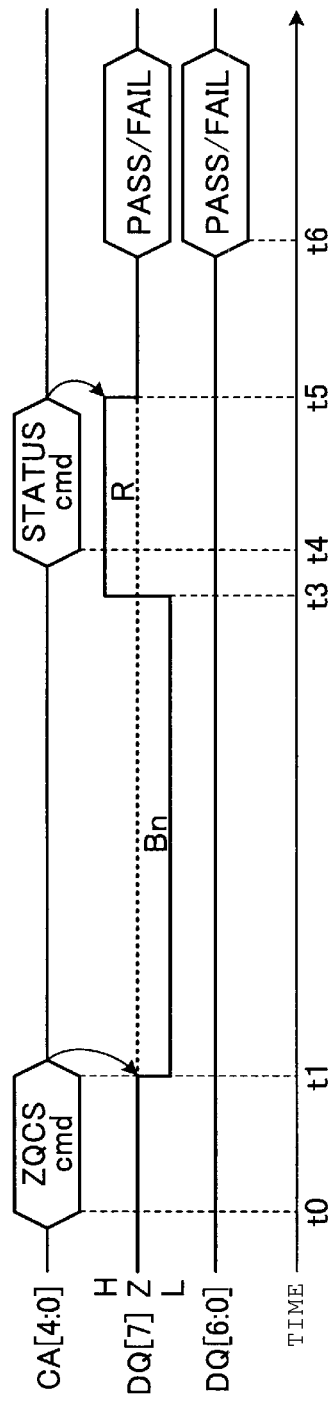
FIG. 2 is an operational timing chart of a first embodiment.

FIG. 2 is an operational timing chart of a first embodiment.

In the first embodiment, in a case where a ZQ command is input, the operating state notification signal (busy or ready signal) is output to one of the data lines DQ7 to DQ0 (in a case of the example of FIG. 2, the data line DQ7 is utilized) which configure the data bus.

When the input of a ZQ calibration short command (hereinafter referred to as ZQCS command) that is the ZQ command is input from the address bus terminal TAD at a time t0, the control circuit 21 executes the ZQ calibration corresponding to the ZQCS command via the input and output control circuit 11 and the command register 15. That is, the control circuit 21 adjusts the impedance of an output driver and on-die termination (ODT) according to the wiring impedance using a connected external high-precision resistor to reduce impedance mismatch. Accordingly, signal reflection is also prevented.

That is, the ZQ calibration is executed so that the influence of variations due to process, voltage and temperature are reduced, the impedance value is appropriately controlled, and a fluctuation range is kept small.

Therefore, in the first embodiment, in order to notify that the ZQCS command is presently being executed and the memory chip 10 is in a busy state where not all commands can be received, the control circuit 21 controls the input and output control circuit 11 at the time t1, and the data line DQ7 is caused to transition from the high impedance state (Z) to the "L" level.

As a result, the external device which is connected to the memory chip 10 and uses the memory chip 10 detects that the data line DQ7 is at the "L" level, and can recognize from this that the memory chip 10 is in the busy state.

When the execution of the ZQCS command is ended, the control circuit 21 controls the input and output control circuit 11 so as to notify an external device connected to the memory chip 10 that the execution of the ZQCS command is completed, shifts to the standby state and is in the ready state at a time t3, the data line DQ 7 is caused to transition from the "L" level to the "H" level.

As a result, the external device connected to the memory chip 10 detects that the data line DQ 7 becomes the "H" level, recognizes from this that the memory chip 10 has shifted to the ready state, and at a time t4, the input of the status command is started to detect whether the result of execution of the ZQCS command is successful, that is, whether it passed (Pass) or failed (Fail).

At the time t4, when the input of the status command is started from the address bus terminal TAD, the control circuit 21 controls the input and output control circuit 11 at a time t5 and changes the data line DQ 7 from the "H" level at the time t5 to the high impedance state (Z).

As a result, at a time t6, the control circuit 21 outputs pass and fail data via the data lines DQ7 to DQ0 and notifies the external device connected to the memory chip 10.

As described above, according to the first embodiment, in the memory chip 10 which does not have a state notification terminal, even during the ZQ calibration period, instead of the busy and ready terminal, the busy and ready signal as the operating state signal of the memory chip 10 can be provided to an externally connected device via the data line DQ7, and the externally connected device can recognize the operating state of the memory chip 10.

In the above description, the data line DQ7 is used to notify, i.e., provide notification of, the operating state or status of the memory chip 10. However, it is possible to use any one of the data lines among the data lines DQ7 to DQ0 which configure the data bus to perform notification by changing the impedance thereof, so long as the data line is selected in advance to be used for this purpose.

In addition to the above, all of the data lines DQ7 to DQ0 can be used to output the pass and fail data. However, it is also possible to use an arbitrary number (i.e., a sub-set) of data lines according to the contents of the pass and data fail required to be output from the memory chip 10.

2. Second Embodiment

In the first embodiment, a configuration in which the operating state notification signal (busy and ready signal) is output to the data line DQ7 is adopted, and the output of the busy and ready information is released by inputting a status command for acquiring the result of the execution of the ZQCS command. However, in the second embodiment, the output of the operating state notification signal (busy and ready signal) is released by receipt of a firstly input command (hereinafter, referred to as a next command) after the end of the ZQ calibration by the input of the ZQCS command, and where the memory chip 10 is in the busy state because it is executing the ZQ calibration, the pass and fail data is output at the time when the state of the memory chip 10 is shifted to the ready state, and the output of the pass and fail data is released as a result of the input of the next command.

Figure 3:
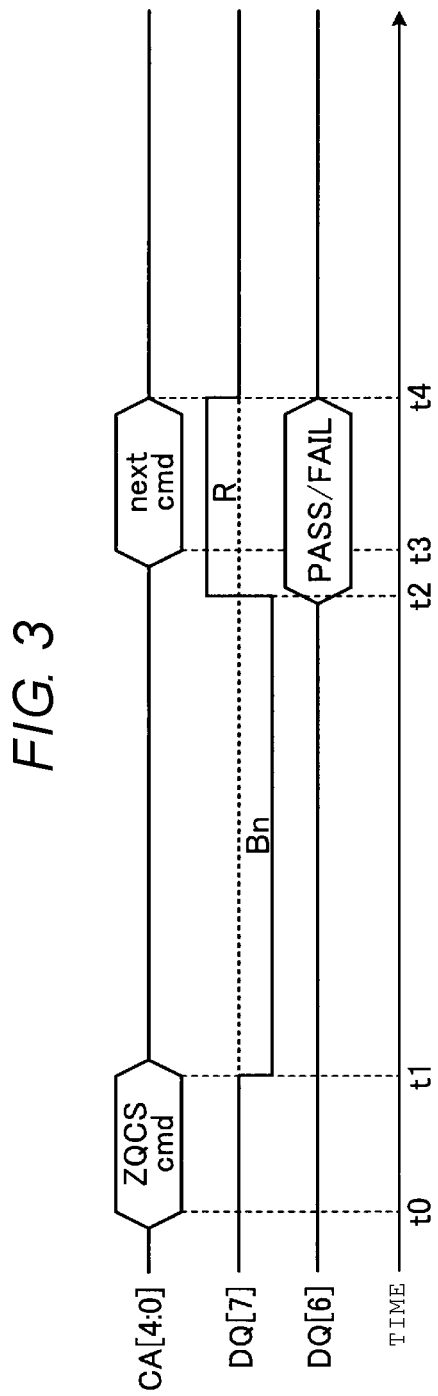
FIG. 3 is an operational timing chart of a second embodiment.

FIG. 3 is an operational timing chart of the second embodiment.

In the second embodiment, similar to the first embodiment, when the ZQ command is input from the address bus terminal TAD, the operating state notification signal (busy and ready signal) is output to one of the data lines DQ7 to DQ0 which configure the data bus (in a case of the example of FIG. 3, the data line DQ7).

In the second embodiment, the output of the pass and fail data is transferred to any one of the data lines other than the data line which outputs the busy or ready information as information of 1 bit of pass or fail (in a case of the example of FIG. 3, data line DQ6).

When that input of the ZQCS command is input from the address bus terminal TAD at the time t0, the control circuit 21 executes the ZQ calibration in accordance with the ZQCS command with the input and output control circuit 11 and the command register 15.

Therefore, also in the second embodiment, similar to the first embodiment, in order to provide notification that the ZQCS command is being executed and the memory chip 10 is in the busy state where it cannot receive all commands, the control circuit 21 controls the input and output control circuit 11 to make the data line DQ7 transition from the high impedance state (Z) to the "L" level at the time t1.

As a result, the external device which is connected to the memory chip 10 and which uses the memory chip 10 detects that the data line DQ7 is now the "L" level, and can recognize that the memory chip 10 is in the busy state.

When execution of the ZQCS command is ended, the control circuit 21 controls the input and output control circuit 11 so as to provide notification that the execution of the ZQCS command is completed, the standby state is entered, and the state of the memory chip 10 is the ready state, and at a time t2, the data line DQ7 is caused to transition from the "L" level to the "H" level.

As a result, the device connected to the outside of the memory chip 10 detects that the data line DQ7 is now at the "H" level and executes some next process, at the time t3, and input of the next command corresponding to the process is started.

In parallel with this, the control circuit 21 controls the input and output control circuit 11 to output the pass and fail data via the data line DQ6 and notify the external device connected to the memory chip 10.

When the input of the next command is ended at the time t4, the control circuit 21 controls the input and output control circuit 11 to make the data line DQ7 transition from the "H" level to the high impedance state (Z). The control circuit 21 controls the input and output control circuit 11 to make the data line DQ6 transition to the high impedance state (Z) and initiates the output of the pass and fail data.

As described above, according to the second embodiment, in addition to the effect of the first embodiment, there is no need to provide a special command for initiating the output of the operating state notification signal (busy and ready signal) and there is no need to change the command system of the device connected to the outside of the memory chip 10.

Furthermore, it is possible to further shorten the effective execution time, which is the time from the input of the ZQ command to the completion of the pass and fail data output, of the ZQ calibration, thereby improving the processing efficiency.

In the above description, the data line DQ7 is used to provide the notification signal of the operating state of the memory chip 10. However, which data line among the data lines DQ7 to DQ0 which configure the data bus is used can be any data line as long as it is selected in advance to be used for this purpose.

In addition, in the above description, the data line DQ6 is used for outputting the pass and fail data. However, as long as the data line is a predetermined data line other than the data line (in the second embodiment, the data line DQ7) used for notifying the operating state of the memory chip 10, any data line can be used.

3. Third Embodiment

In the second embodiment, in order to release the output of the operating state notification signal (busy and ready signal) and release the output of the pass and fail data, a configuration of using the receipt of the next command, which is another command firstly input after the execution of the ZQ calibration, is adopted. However, in the third embodiment, a status reset command is newly provided for releasing the output of the operating state notification signal (busy and ready signal) and releasing the output of the pass and fail data, and each is individually released.

Figure 4:
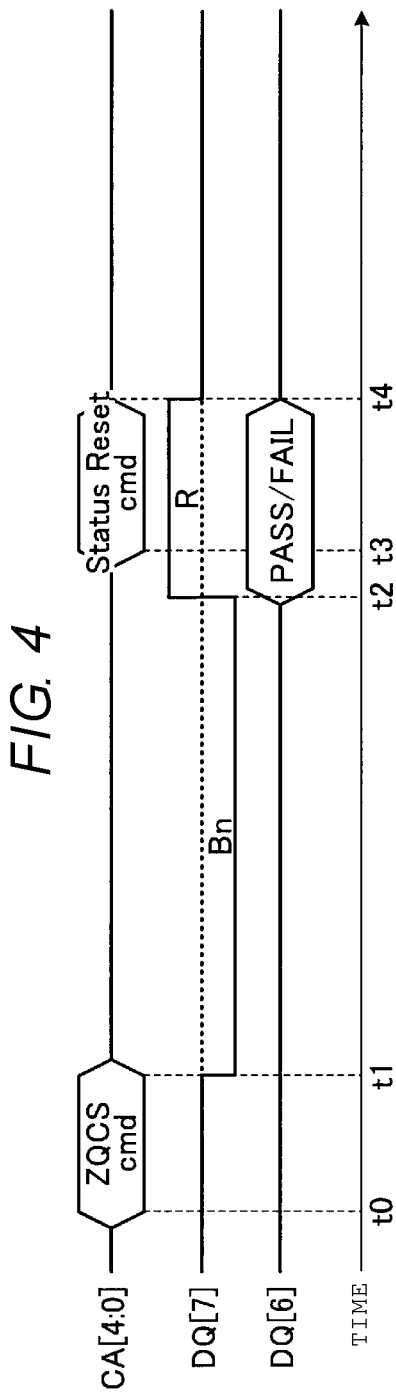
FIG. 4 is an operational timing chart of a third embodiment.

FIG. 4 is an operational timing chart of a third embodiment.

In the third embodiment, similar to the second embodiment, in a case where the ZQ command is input from the address bus terminal TAD, the operating state notification signal (busy and ready signal) is transmitted to the data line DQ7 which configures the data bus and outputs the pass and fail data to the data line DQ6.

When the ZQCS command is input from the address bus terminal TAD at the time t0, the control circuit 21 executes the ZQ calibration corresponding to the ZQCS command with the input and output control circuit 11 and the command register 15 of the memory chip 10.

Therefore, also in the third embodiment, similar to the second embodiment, in order to provide notification that the ZQCS command is being executed and the memory chip 10 is in the busy state where it cannot receive all commands, the control circuit 21 controls the input and output control circuit 11 to make the data line DQ7 transition from the high impedance state (Z) to the "L" level at the time t1.

As a result, the external device which is connected to the semiconductor memory device 100 and which uses the memory chip 10 detects that the data line DQ7 is at the "L" level, and can recognize that the memory chip 10 is in the busy state.

When execution of the ZQCS command is ended, the control circuit 21 of the memory chip 10 controls the input and output control circuit 11 so as to provide notification that the execution of the ZQCS command is completed, the standby state is entered, and the state of the memory chip 10 is the ready state, and at the time t2, the data line DQ7 is caused to transition from the "L" level to the "H" level.

In parallel with this, the control circuit 21 of the memory chip 10 controls the input and output control circuit 11 to output the pass and fail data via the data line DQ6 and provide notification to the external device connected to the semiconductor memory device 100.

As a result, the external device connected to the semiconductor memory device 100 detects that the data line DQ7 is now at the "H" level, and the output of the operating state notification signal (busy and ready signal) in the memory chip 10 and the output of the pass and fail data are released, and the input of the status reset command is started at the time t3.

When the input of the status reset command is ended at the time t4, the control circuit 21 of the memory chip 10 controls the input and output control circuit 11 to make the data line DQ7 transition from the "H" level to the high impedance state (Z). The control circuit 21 controls the input and output control circuit 11 to make the data line DQ6 transition to the high impedance state (Z) and releases the output of the pass and fail data.

As described above, according to the third embodiment, in addition to the effect of the second embodiment, the ZQ calibration in the specific memory chip 10 can be executed in the semiconductor memory device 100 of the multi-chip configuration.

In the above description, the data line DQ7 is used to provide the notification of the operating state of the memory chip 10. However, which data line among the data lines DQ7 to DQ0 which configure the data bus is used can be any data line as long as it is determined in advance.

In addition, in the above description, the data line DQ6 is used for outputting the pass and fail data. However, as long as the data line is a predetermined data line other than the data line (in the second embodiment, the data line DQ7) used for providing notification of the operating state of the memory chip 10, any data line can be used.

4. Fourth Embodiment

In each of the above embodiments, one of the data lines DQ7 to DQ0 is used to provide notification of the state of the memory chip 10. However, the fourth embodiment is an embodiment in the case of using the data strobe signal line DQS for notification.

Figure 5:
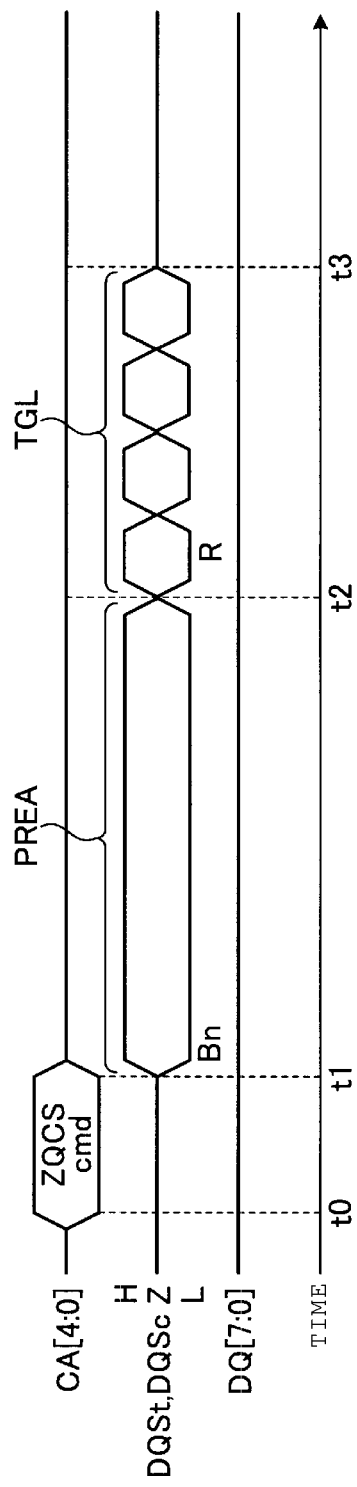
FIG. 5 is an operational timing chart of a fourth embodiment.

FIG. 5 is an operational timing chart of the fourth embodiment.

Hereinafter, the configuration of the memory chip 10 shown in FIG. 1 will be described again.

In the fourth embodiment, the operating state notification signal (busy and ready signal) is output to the data strobe signal line DQS.

Assuming that input of the ZQCS command is input from the address bus terminal TAD at the time t0, the control circuit 21 executes the ZQ calibration in accordance with the ZQCS command with the input and output control circuit 11 and the command register 15.

Therefore, also in the fourth embodiment, similar to the first embodiment, in order to provide notification that the ZQCS command is being executed and the memory chip 10 is in the busy state where it cannot receive all commands, the control circuit 21 controls the input and output control circuit 11 to transition the data strobe signal line DQS from the high impedance state (Z) to one of the "H" level or the "L" level at the time t1 to maintain the state, thereby forming a preamble section PREA.

As a result, the external device which is connected to the memory chip 10 and which uses the memory chip 10 detects that the data strobe signal line DQS is not in the high impedance state (Z) or the data strobe signal line DQS is at the "H" level or the "L" level, and can recognize that the memory chip 10 is in the busy state.

When execution of the ZQCS command is ended, the control circuit 21 controls the input and output control circuit 11 so as to provide notification that the execution of the ZQCS command is completed, the standby state is entered, and the state of the memory chip 10 is the ready state, and at the time t2, transitions the signal on the data strobe signal line DQS from the preamble section PREA to a toggle portion TGL for alternately toggling between the "H" level and the "L" level.

At the time t3, the control circuit 21 controls the input and output control circuit 11 and transitions the signal on the data strobe signal line DQS from the toggle portion TGL for alternately toggling between the "H" level and the "L" level to the high impedance state (Z).

As described above, according to the fourth embodiment, in the memory chip 10 which does not have the state notification terminal even during the ZQ calibration period, instead of the busy and ready terminal, the operating state notification signal (busy and ready signal) corresponding to the operating state of the memory ship 10 can be provided to the externally connected device through the data strobe signal line DQS, and the externally connected device can recognize the operating state of the memory chip 10.

5. Fifth Embodiment

In the above fourth embodiment, a configuration in which the busy and ready information is output to the data strobe signal line DQS is adopted. However, in the fifth embodiment, the memory chip 10 is in the busy state while executing the ZQ calibration, and then the pass and fail data is output at the time when the state of the memory cell is shifted to the ready state.

Figure 6:
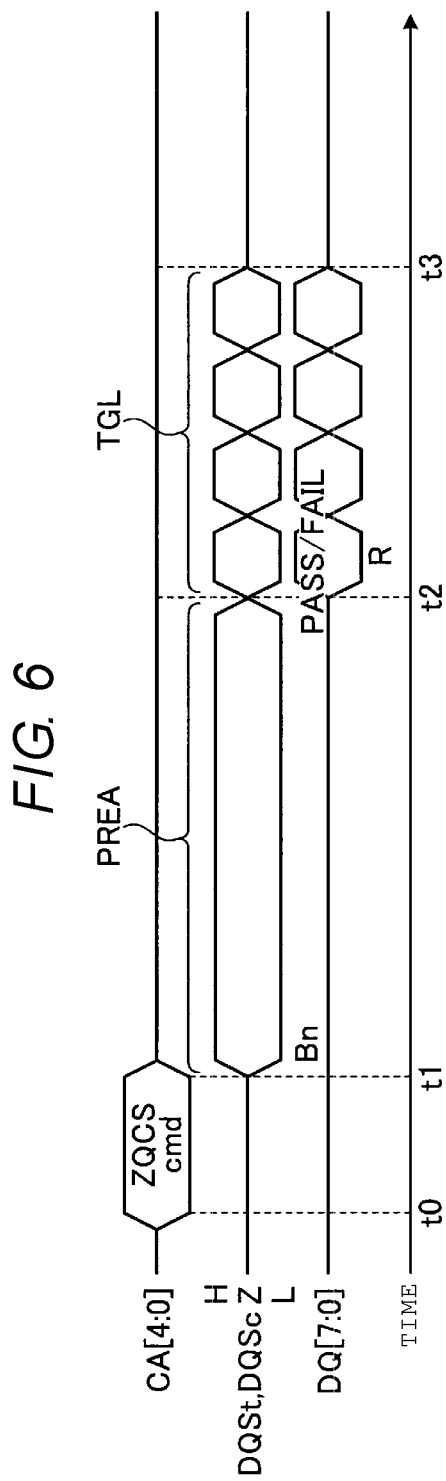
FIG. 6 is an operational timing chart of a fifth embodiment.

FIG. 6 is an operational timing chart of the fifth embodiment.

Hereinafter, the configuration of the memory chip 10 shown in FIG. 1 will be described.

In the fifth embodiment, the busy and ready information is output to the data strobe signal line DQS and the pass and fail data is output to the data lines DQ7 to DQ0.

Assuming that input of the ZQCS command is input from the address bus terminal TAD at the time t0, the control circuit 21 executes the ZQ calibration in accordance with the ZQCS command via the input and output control circuit 11 and the command register 15.

Therefore, also in the fifth embodiment, similar to the fourth embodiment, in order to provide notification that the ZQCS command is being executed and the memory chip 10 is in the busy state where it cannot receive all commands, the control circuit 21 controls the input and output control circuit 11 to transition the data strobe signal line DQS from the high impedance state (Z) to the "H" level or the "L" level at the time t1, thereby forming the preamble section PREA.

As a result, the external device which is connected to the memory chip 10 and which uses the memory chip 10 detects that the data strobe signal line DQS is not in the high impedance state (Z) or the data strobe signal line DQS is at the "H" level or the "L" level, and can recognize that the memory chip 10 is in the busy state.

When execution of the ZQCS command is ended, the control circuit 21 controls the input and output control circuit 11 so as to provide notification that the execution of the ZQCS command is completed, the standby state is entered, and the memory chip 10 is in the ready state, and at the time t2, transitions the signal on the data strobe signal line DQS from the preamble section PREA to a toggle portion TGL for alternately toggling between the "H" level and the "L" level.

In parallel with this, the control circuit 21 outputs the pass and fail data to the data lines DQ7 to DQ0 and outputs the data in a toggle state in which the pass and fail data is inverted in synchronization with the toggle state of the data strobe signal line DQS.

At the time t3, the control circuit 21 controls the input and output control circuit 11 and transitions the data strobe signal line DQS and the data lines DQ7 to DQ0 from the toggle portion TGL for alternately toggling between the "H" level and the "L" level to the high impedance state (Z).

As described above, according to the fifth embodiment, in addition to the effect of the fourth embodiment, it is possible to further shorten the effective execution time (the time from the input of the ZQ command to the completion of the pass and fail data output) of the ZQ calibration, thereby improving the processing efficiency.

6. Sixth Embodiment

In the fourth embodiment and the fifth embodiment, the time from the end of the input of the ZQ calibration command (in FIGS. 5 and 6, the ZQCS command) to the end of the execution of the ZQ calibration is set as the preamble section PREA. However, the sixth embodiment is a case in which the preamble section PREA is shortened by setting the time from a read latency tRL, the write latency tWL, or the ZQ calibration latency tZQL has elapsed from the start of the input of the ZQ calibration command to the end of execution of the ZQ calibration as the preamble section PREA.

Here, the ZQ calibration latency tZQL includes both the ZQ calibration long latency tZQLL and the ZQ calibration short latency tZQLS, which are the latency at the time of ZQ calibration, and actually the ZQ calibration latency tZQL is ZQ calibration and be specified based on the shortest time necessary for the ZQ calibration.

Figure 7:
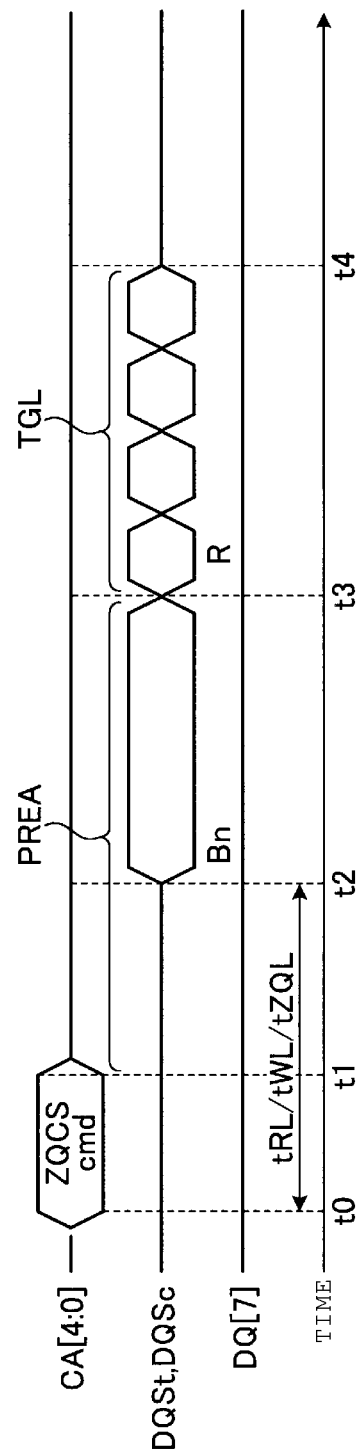
FIG. 7 is an operational timing chart of a sixth embodiment.

FIG. 7 is an operational timing chart of the sixth embodiment.

Hereinafter, the configuration of the memory chip 10 shown in FIG. 1 will be described.

Assuming that input of the ZQCS command is input from the address bus terminal TAD at the time t0, the control circuit 21 executes the ZQ calibration in accordance with the ZQCS command using the input and output control circuit 11 and the command register 15. Thereafter, at the time t1, the input of the ZQCS command from the address bus terminal TAD is ended.

In parallel with this, at the time t2 when the read latency tRL, the write latency tWL, or the ZQ calibration latency tZQL has elapsed from the time t0, the control circuit 21 controls the input and output control circuit 11 in order to notify that during executing the ZQCS command, the memory chip 10 is in the busy state where all commands cannot be received, at the time t1, the data strobe signal line DQS transitions from the high impedance state (Z) to the "H" level or the "L" level, and the state is maintained to form the preamble section PREA.

As a result, the external device which is connected to the memory chip 10 and which uses the memory chip 10 detects that the data strobe signal line DQS is not in the high impedance state (Z) or is at the "H" level or "L" level and it is possible to recognize that the memory chip 10 is in the busy state.

When execution of the ZQCS command is ended, the control circuit 21 controls the input and output control circuit 11 so as to provide notification that the execution of the ZQCS command is completed, the standby state is entered, and the memory chip 10 is in the ready state, and at the time t3, transitions the signal on the data strobe signal line DQS from the preamble section PREA to the toggle portion TGL for alternately toggling between the "H" level and the "L" level.

At the time t4, the control circuit 21 controls the input and output control circuit 11 and transitions the signal on the data strobe signal line DQS and the data lines DQ7 to DQ0 from the toggle portion TGL for alternately toggling between the "H" level and the "L" level to the high impedance state (Z).

As described above, according to the sixth embodiment, in addition to the effect of the fourth embodiment, it is possible to shorten the period of the preamble section PREA, thereby improving the processing efficiency.

In the above description, the pass and fail data is not output, but it is also possible to output the pass and fail data similarly to the fifth embodiment.

7. Seventh Embodiment

In the fourth embodiment to the sixth embodiment, the data strobe signal line DQS is set in the toggle state after the execution of the ZQC command is completed. However, in the seventh embodiment, the data strobe signal line DQS (or the data signal line DQ) is toggled during the execution of the ZQC command, thereby notifying that the memory chip 10 is in the busy state.

Figure 8:
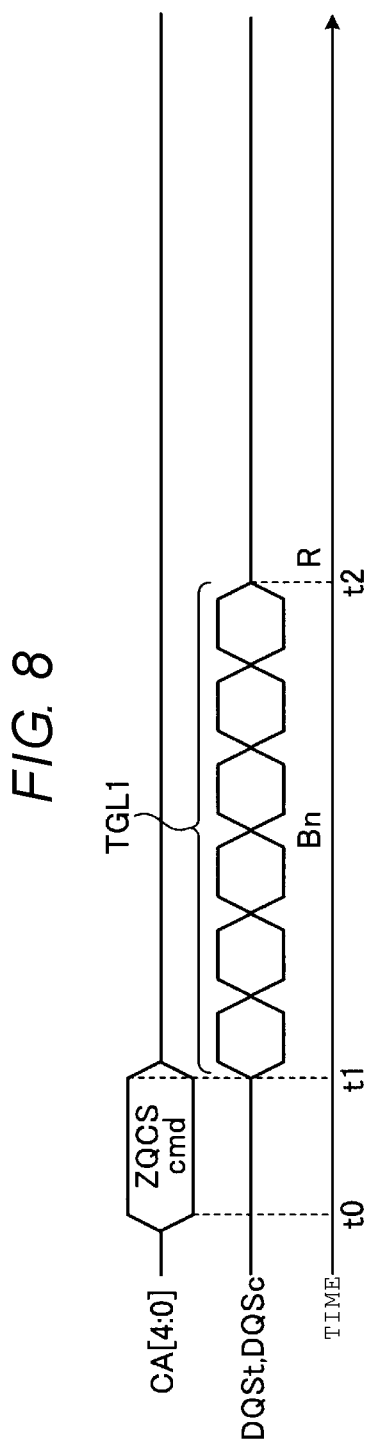
FIG. 8 is an operational timing chart of a seventh embodiment.

FIG. 8 is an operational timing chart of the seventh embodiment.

Hereinafter, the configuration of the memory chip 10 shown in FIG. 1 will be described again.

Assuming that input of the ZQCS command is input from the address bus terminal TAD at the time t0, the control circuit 21 executes the ZQ calibration in accordance with the ZQCS command with the input and output control circuit 11 and the command register 15.

Thereafter, when the input of the ZQCS command from the address bus terminal TAD ends at the time t1, the control circuit 21 transitions the signal on the data strobe signal line DQS from the high impedance state (Z) to a toggle portion TGL1 for alternately transiting between the "H" level and the "L" level.

As a result, the external device which is connected to the memory chip 10 and which uses the memory chip 10 detects that the data strobe signal line DQS is not in the high impedance state (Z) and the signal is transitioned to the toggle portion TGL1, and the external device can recognize that the memory chip 10 is in the busy state.

When the execution of the ZQ calibration is completed at the time t2, the control circuit 21 controls the input and output control circuit 11 and transitions the signal on the data strobe signal line DQS from the toggle portion TGL1 for alternately toggling between the "H" level and the "L" level to the high impedance state (Z), and provides notification that the memory chip 10 is in the ready state.

As described above, according to the seventh embodiment, effects similar to that of the fourth embodiment can be obtained.

In the above description, the pass and fail data is not output, but it is also possible to output the pass and fail data similar to the fifth embodiment.

8. Eighth Embodiment

In each of the above-described embodiments, the state of the chip enable signal CEn is considered. However, the eighth embodiment the chip enable signal CEn provides the operating state notification signal in the active state.

Figure 9:
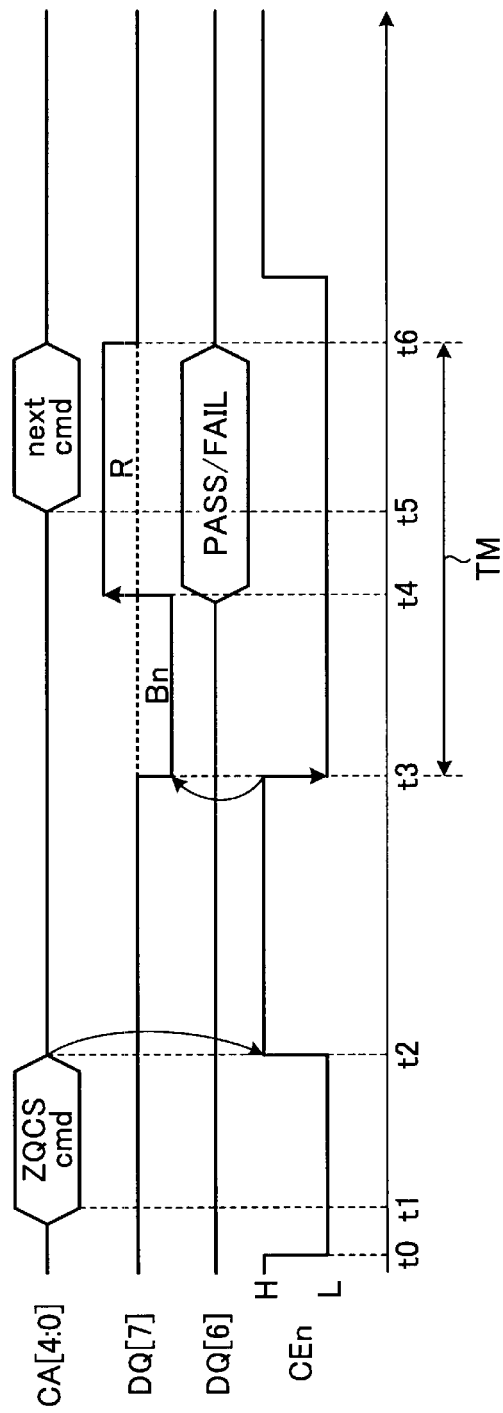
FIG. 9 is an operational timing chart of an eighth embodiment.

FIG. 9 is an operational timing chart of the eighth embodiment.

In the second embodiment, similar to the first embodiment, in a case where a ZQ command is input from the address bus terminal TAD, the operating state notification signal (busy and ready signal) is output to one of the data lines DQ7 to DQ0 (in a case of an example of FIG. 9, the data line DQ7) which configure the data bus.

In the eighth embodiment, the output of the pass and fail data is transferred through any one of the data lines other than the data line which outputs the busy and ready information as information of 1 bit of pass or fail (in a case of the example of FIG. 9, data line DQ6).

Assuming that at the time t0 the chip enable signal CEn becomes active (in a case of an example of FIG. 9, the "L" level), the input of the ZQCS command is started from the address bus terminal TAD at the time t1, and the input of the ZQCS command is ended at the time t2, the chip enable signal CEn becomes inactive (in a case of an example of FIG. 9, the "H" level).

In parallel with this, the control circuit 21 executes the ZQ calibration corresponding to the ZQCS command with the input and output control circuit 11 and the command register 15.

Therefore, also in the eighth embodiment, similarly to the second embodiment, the control circuit 21 shifts to the execution of the ZQCS command, and enters the busy state in which not all of the commands can be received.

Thereafter, in order to provide notification that it is in the busy state where it cannot receive all commands, when the chip enable signal CEn becomes active (in a case of an example of FIG. 9, the "L" level) during the execution of the ZQCS command, again at the time t3, the control circuit 21 controls the input and output control circuit 11 to make the data line DQ7 transition from the high impedance state (Z) to the "L" level.

As a result, the external device which is connected to the memory chip 10 and which uses the memory chip 10 detects that the data line DQ7 is at the "L" level, and can recognize that the memory chip 10 is in the busy state.

When execution of the ZQCS command is ended, the control circuit 21 of the memory chip 10 controls the input and output control circuit 11 so as to provide notification that the execution of the ZQCS command is completed, the standby state is entered, and the memory chip 10 is in the ready state, and at the time t4, the data line DQ7 is caused to transition from the "L" level to the "H" level.

In parallel with this, the control circuit 21 controls the input and output control circuit 11 to output the pass and fail data via the data line DQ6 and provide notification to the external device connected to the memory chip 10.

As a result, since the external device connected to the memory chip 10 detects that the data line DQ7 is at the "H" level and executes some next process, at the time t5, input of the next command corresponding to some process is started.

When the input of the next command is ended at the time t4, the control circuit 21 controls the input and output control circuit 11 to make the data line DQ7 transition from the "H" level to the high impedance state (Z). The control circuit 21 controls the input and output control circuit 11 to make the data line DQ6 transition to the high impedance state (Z) and releases the output of the pass and fail data.

As described above, according to the eighth embodiment, since the configuration in which the operating state notification signal (busy and ready signal) is provided only during the period when the chip enable signal CEn is active is adopted in addition to the effects of the second embodiment, it is not necessary to lengthen the notification period of the operating state notification signal (busy and ready signal) unnecessarily, thereby improving the processing efficiency.

In the above description, a configuration that in the period TM, notifications of operating state notification signals (busy and ready signals), the output of the pass and fail data, and input of the next commands are performed is adopted.

However, in the period TM, it is possible to perform the process from the time t1 to the time t3 in the fourth embodiment shown in FIG. 5, the process from the time t1 to the time t3 in the fifth embodiment shown in FIG. 6, the process from the time t2 to the time t4 in the sixth embodiment after the time t0 to the time t2 in the sixth embodiment shown in FIG. 7, or the process from the time t1 to the time t2 in the seventh embodiment shown in FIG. 8.

In the above description, the data line DQ7 is used to provide the notification signal of the operating state of the memory chip 10. However, which data line among the data lines DQ7 to DQ0 which configure the data bus is used can be any data line as long as it is determined in advance.

In addition, in the above description, the data line DQ6 is used for outputting the pass and fail data. However, as long as the data line is a predetermined data line other than the data line (in the second embodiment, the data line DQ7) used for notifying the operating state of the memory chip 10, any data line can be used.

The program executed by the semiconductor memory device of the present embodiment is provided by being incorporated in a ROM or the like in advance.

The program to be executed in the semiconductor memory device of the present embodiment is a file in an installable format or an executable format and is stored in a storage medium such as a CD-ROM, a portable semiconductor memory device (such as a USB memory), a digital versatile disk (DVD) or may be provided by being recorded on a computer readable recording medium.

Furthermore, the program executed in the semiconductor memory device of the present embodiment may be stored on a computer connected to a network such as the Internet and provided by being downloaded via the network. In addition, the program executed in the semiconductor memory device of the present embodiment may be provided or distributed via a network such as the Internet.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device not equipped with an operating state notification terminal for providing notification of the operating state of the memory device, comprising:
 a data bus comprising a plurality of signal lines; and
 a controller configured to:
   adjust an output impedance of a signal line when the memory device is in a busy state and cannot receive signals transmitted thereto to provide notification of the operating state of the memory device during a ZQ calibration of the memory device.

2. The memory device according to claim 1, wherein the memory device further comprises at least one of a data line and a data strobe line, and the at least one of the data line and data strobe line is the signal line.

3. The memory device according to claim 1, wherein the controller is further configured to provide notification of the operating state of the memory device upon receiving a notification releasing command input thereto after receiving a command instructing an execution of the ZQ calibration.

4. The memory device according to claim 1, wherein the notification releasing command comprises one of:
 a status command requesting an execution result of the ZQ calibration;
 another command received by the memory device after receipt of the command instructing execution of the ZQ calibration; and a status reset command for releasing notification of the operating state of the memory device.

5. The memory device according to claim 1, wherein the controller is further configured to:
generate, on the signal line, a signal including a preamble section of a fixed impedance level indicating a busy state and a toggle portion having two different impedances generated sequentially indicating a ready state.

6. The memory device according to claim 5, wherein the controller is further configured to:
provide the preamble section in synchronization with the timing of the end of the time period of the receipt thereby of a command instructing the execution of the ZQ calibration.

7. The memory device according to claim 5, wherein the controller is further configured to:
output the preamble section in synchronization with one of a predetermined read latency, predetermined write latency, and an elapsed timing of a predetermined ZQ calibration latency.

8. The memory device according to claim 7, wherein the ZQ calibration latency is set to a value corresponding to the latency of one of a ZQ calibration long and a ZQ calibration short.

9. The memory device according to claim 1, wherein the controller is further configured to:
provide a signal toggling a voltage level between the two different values and a high impedance portion fixed in a high impedance state indicating the ready state as the operating state notifying signal.

10. The memory device according to claim 1, wherein the memory device outputs the operating state notification signal when a chip enable signal is in an enable state.

11. A method to be executed in a semiconductor memory device that is equipped with a data bus and not equipped with an operating state notification terminal for providing a notification of an operating state of the semiconductor memory device, the method comprising:
receiving a ZQ calibration command for correcting an output impedance of the semiconductor memory device;
performing the ZQ calibration; and
providing notification of an operating state of the semiconductor memory device during the ZQ calibration using a signal line of the data bus.

12. The method according to claim 11, wherein providing notification of the operating state of the semiconductor memory device during the ZQ calibration comprises changing an impedance of the signal line to a value other than a normal value.

13. The method according to claim 11, further comprising:
providing a ZQ calibration completed signal when ZQ calibration is completed.

14. The method of claim 11, further comprising:
receiving, over the data bus, a status reset command.

15. The method according to claim 11, further comprising:
after completion of the ZQ calibration, switching the impedance of the signal line between two values, different than the normal value.

16. The method according to claim 15, further comprising:
outputting data concerning a passing of the ZQ calibration on a signal line other than the signal line used to provide notification of the operating state of the memory device.

17. A non-volatile computer readable storage medium comprising program instructions that when executed cause a semiconductor memory device that is equipped with a data bus but not equipped with an internal state notification terminal for notifying an internal state to:
receive a ZQ calibration command for correcting an output impedance of the semiconductor memory device;
perform a ZQ calibration upon receiving the ZQ calibration command; and
provide notification of an operating state of the semiconductor memory device during the ZQ calibration using a signal line of the data bus.

18. The non-volatile computer readable storage medium storing according to claim 17, further comprising program instructions that when executed cause the semiconductor memory device to:
provide the operating state notification signal by changing the impedance of the signal line.

19. The non-volatile computer readable storage medium storing according to claim 17, further comprising program instructions that when executed cause the semiconductor memory device to:
switch the impedance of the signal line between two values other than the normal impedance thereof after completion of the ZQ calibration.

20. The non-volatile computer readable storage medium storing according to claim 17, further comprising program instructions that when executed cause the semiconductor memory device to:
output data concerning a passing of the ZQ calibration on a signal line other than the signal line used to provide notification of the operating state of the semiconductor memory device.

* * * * *